United States Patent
Hwang et al.

(10) Patent No.: US 6,576,690 B1
(45) Date of Patent: Jun. 10, 2003

(54) PHOSPHOROUS-CONTAINING FLAME RETARDING EPOXY RESIN AND AN EPOXY RESIN COMPOSITION CONTAINING THE SAME

(75) Inventors: Kuen-Yuan Hwang, Hsinchu Industrial District (TW); Hong-Hsing Chen, Hsinchu Industrial District (TW); Chih-Fu Chen, Hsinchu Industrial District (TW)

(73) Assignee: Chang Chung Plastics Co., Ltd. (TW)

( * ) Notice: Subject to any disclaimer, the term of this patent is extended or adjusted under 35 U.S.C. 154(b) by 0 days.

(21) Appl. No.: 10/104,567

(22) Filed: Mar. 22, 2002

(51) Int. Cl.[7] .............................. C08K 3/36; C08L 63/02
(52) U.S. Cl. .................. 523/466; 525/481; 525/525; 525/533; 528/99; 528/112; 549/512; 549/522
(58) Field of Search .................... 523/466; 525/481, 525/525, 533; 528/99, 112; 549/512, 522

(56) References Cited

U.S. PATENT DOCUMENTS 6,291,627 B1 * 9/2001 Wang ........................... 528/99

FOREIGN PATENT DOCUMENTS

| JP | 9235449 | 9/1997 |
| TW | 339353 | 9/1998 |

* cited by examiner

*Primary Examiner*—Robert Dawson
*Assistant Examiner*—D. Aylward
(74) *Attorney, Agent, or Firm*—Elliott N. Kramsky

(57) ABSTRACT

The present invention relates to a phosphorous-containing flame retarding epoxy resin and their composition comprising the nitrogen-containing flame retarding epoxy resin. More specifically, the present invention relates to a flame retarding epoxy resin having a pendent phosphorous-containing functional group and their composition comprising the nitrogen-containing flame retarding epoxy resin. The flame retarding phosphorous-containing epoxy resin and the epoxy resin composition containing the same of the present invention possess excellent flame retarding property and heat resistance without containing halogen and diantimony trioxide. Therefore they are useful as an encapsulating material in the semiconductor industry and the cured article prepared from the composition exhibits excellent molding ability and excellent reliance.

9 Claims, No Drawings

PHOSPHOROUS-CONTAINING FLAME RETARDING EPOXY RESIN AND AN EPOXY RESIN COMPOSITION CONTAINING THE SAME

FIELD OF THE INVENTION

The present invention relates to a phosphorous-containing flame retarding epoxy resin and their composition comprising the nitrogen-containing flame retarding epoxy resin. More specifically, the present invention relates to a flame retarding epoxy resin having a pendent phosphorous-containing functional group and their composition comprising the nitrogen-containing flame retarding epoxy resin.

BACKGROUND OF THE INVENTION

Under the consideration of economics and productivity, an encapsulating material for currently semiconductor devices is mostly an epoxy-based resin composition. To insure the use safety, electronic parts for the semiconductor are required to meet a flame retarding specification regulated by the UL. The approach to attain the flame retarding specification is addition of halogen-containing epoxy resin and diantimony trioxide as a flame retarding assistant into epoxy resin compositions for encapsulating electronic parts. However, it is known that such flame retarding assistants are harmful to human and animal. For example, diantimony trioxide has been classified a cancerous material while an epoxy resin containing halogen such as bromine will produce corrosive bromine free radical and hydrogen bromide during burning. Also, an aryl compound containing high content bromine will produce toxic brominated furanes and brominated dioxins compounds. Such toxic materials have adverse effects to human, animal and environment. Thus, it is eagerly required to semiconductor manufacture for developing a novel epoxy resin without halogen neither diantimony trioxide to resolve the problems associated with the use of halogen-containing epoxy resin and diantimony trioxide.

For flame retarding resins, a phosphorous-containing compound is widely used as a new generation flame retarding agent. Among others, it commonly uses phosphorus or phosphorous-containing organic compound (e.g. triphenyl phosphate (TPP), tricresyl phosphate (TCP), and phosphoric acid etc.,) as a flame retarding agent instead of halogen-containing flame retarding agents to improve flame retarding characteristic of thermosetting resin. By using such a conventional phosphorous-containing compound as a flame retarding agent, it is required to incorporate such a flame retarding agent in a large amount into epoxy resin composition formulations due to its poor flame retardant effect. It will cause lowering of relative amount of the epoxy resin and the curing agent contained in the formulation so that the performances of the epoxy formulation will decrease. Moreover, since the conventional phosphorous-containing compound has low molecular weight and in turn exhibits a high migration, it will directly affect the characteristics of the resulting epoxy resin, e.g. electrical property and strength, etc., and will make it impracticable. For example, Taiwan Patent Publication No. 339353 discloses the use of red phosphorous in stead of halogen and antimony compound as a flame retarding agent. However, when the article prepared from the resin containing red phosphorous is boiled at an elevated temperature, the red phosphorous contained therein will be hydrolyzed resulting in hazardous operation and then affect adversely on the process and product.

Recently, under the considerations of environmental protection and safety, a reactive type resin flame retarding agent is used to substitute for currently used flame retarding agent, especially a phosphorous-containing flame retarding agent is used in stead of brominated epoxy resin. For example, Japanese Patent Unexamined Publication Hei 9-235449 discloses the use a phosphorous-containing epoxy resin in stead of halogen and antimony compound as a flame retarding agent. The patent publication claims that the composition having the phosphorous-containing epoxy resin has improved fire resistance and would not produce dioxine during burning. However, since such additive type and reactive type phosphorous-containing substances possess low phosphorous content, the composition containing such phosphorous-containing substance exhibits poor fire resistance. To attain desired flame retarding effect, it is required to incorporating such a flame retarding agent in a large amount into epoxy resin composition formulations. It will cause lowering of relative amount of the epoxy resin and the curing agent contained in the formulation so that the performances of the epoxy formulation will decrease.

To replace of a halogen-containing compound and antimony-containing compound, it has recently developed a nitrogen- or phosphorous-containing compound as flame retarding agent. Most commonly used nitrogen-containing compound includes, for example, melamine, DICY, triazine-containing cyanate, etc. The phosphorous-containing compound includes reactive type phosphorous-containing compound having reactive functional group, and non-reactive type phosphorous-containing compound. The reactive type phosphorous-containing compound possesses a better heat stability than the non-reactive type phosphorous-containing compound since the reactive functional group contained therein could react with the other components to form a bond between therein. Therefore, the reactive type phosphorous-containing compound becomes a developed main stream in the future.

The most commonly used reactive type phosphorous-containing compound is a straight chain phosphorous-containing compound. Such a straight chain phosphorous-containing compound have a group of —O—P—O— in the main chain, it exhibits poor fire resistance than the flame retarding agent with or without containing halogen. Also, the straight chain reactive type phosphorous-containing compound or non-reactive type phosphorous-containing compound has poor processing ability.

To overcome the disadvantages associated with the current semiconductor encapsulating technique, the present inventors have investigated on epoxy resin and then developed a modified phosphorous-containing epoxy resin. Thus the present invention is completed.

DETAILED DESCRIPTION OF THE PRESENT INVENTION

The present invention relates to a phosphorous-containing flame retarding epoxy resin and their composition comprising the nitrogen-containing flame retarding epoxy resin. More specifically, the present invention relates to a flame retarding epoxy resin having a pendent phosphorous-containing functional group and their composition comprising the nitrogen-containing flame retarding epoxy resin.

The present invention relates to a phosphorous-containing epoxy resin of the following formula:

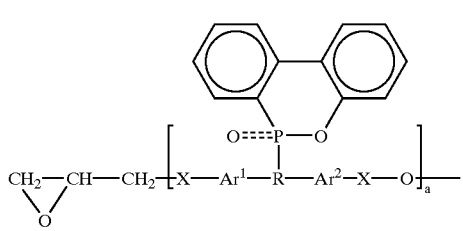
(I)

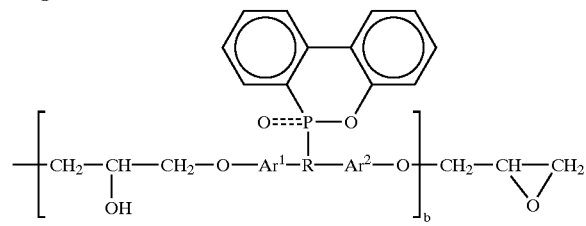

wherein R represents a C1–6 alkylene group;

a represents an integral number of from 1 to 10;

b represents an integral number of from 0 to 10;

X represents a group of formula —(O—CH$_2$—CH(OH)—CH$_2$—O—M—)$_y$—, in which y represents an integral number of from 0 to 20; and M represents a group selected from the following groups (E1)□(E2), and (E3):

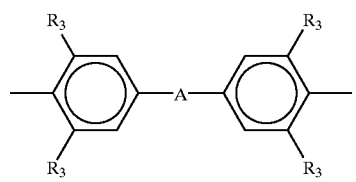
(E1)

wherein R$_3$ represents a C$_{1-6}$ alkyl group; A represents a chemical bond, —O—, —S—, —SO$_2$—, —CO—, C$_{1-6}$ alkylene group, or a group of the following formula:

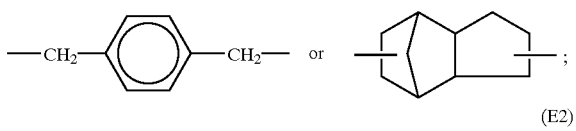

(E2)

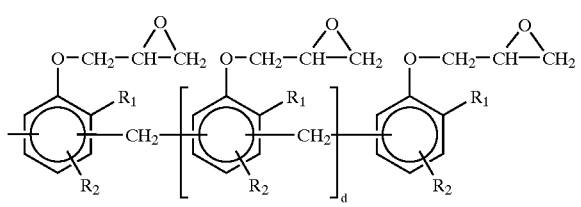

wherein R$_1$ represents a hydrogen atom or a C$_{1-6}$ alkyl group, d represents an integral number of from 0 to 6, R$_2$s are the same or different and represent a hydrogen atom or a group of the following formula:

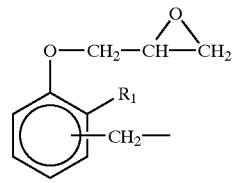

in which R$_1$ is the same as defined above;

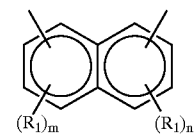
(E3)

in which R$_1$ is the same as defined above; m and n are the same or different and represent an integral number of from 0 to 3;

Ar$^1$ and Ar$^2$ are the same or different and represent a group selected from the following formulae (E3) or (E4):

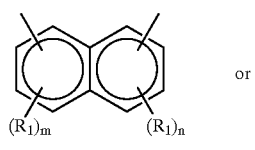
(E3)

or

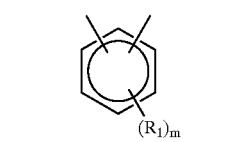
(E4)

wherein R$_1$, m, and n are the same as defined above.

The phosphorous-containing epoxy resin of the present invention is obtained from the steps of addition reacting a phosphorous-containing compound having the following formula:

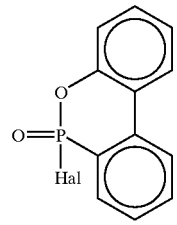

(in which Hal represents a halogen atom, e.g. fluorine, chlorine, bromine, or iodine, etc.) with aldehydes having reactive functional group, then condensing reacting with phenols, and finally reacting with epihalohydrins.

As the phosphorous atom is located on the side chain of the phosphorous-containing epoxy resin of the present invention, the difference between the phosphorous-containing epoxy resin of the present invention and an epoxy resin is lowered when the phosphorous-containing epoxy resin is directly added into an epoxy resin composition. Thus, the processing problem associated with the halogen-containing epoxy resin will be overcome. Moreover, since the side chain molecular will decrease the flow ability of the phosphorous-containing epoxy resin of the present invention, the epoxy resin exhibit high stability at an elevated temperature which will result in more excellent heat resistance. The phosphorous-containing epoxy resin of the present invention has excellent flame retardant effect and heat resistance, it is therefore useful as an encapsulating material for semiconductor and imparts the encapsulated article with excellent flame retardant effect and heat resistance. Further, the phosphorous -containing epoxy resin of the present invention is also useful as a flame retarding agent or stabilizer for resin other than epoxy resin, such as thermosetting and thermoplastic resin and is useful for producing various electronic products.

The term "$C_{1-6}$ alkyl group" used herein means a liner or branched alkyl group having 1 to 6 carbon atoms, such as methyl, ethyl, n-propyl, isopropyl, n-butyl, s-butyl, t-butyl, n-pentyl, isopentyl, n-hexyl and isohexyl and the like.

The term "$C_{1-6}$ alkylene group" used herein means a residue obtained by subtracting two hydrogens atom from a linear or branched alkane having 1 to 6 carbon atoms.

The flame retarding phosphorous-containing epoxy resin of the present invention has a high nitrogen content thus possesses excellent flame retarding effect and heat resistance, it therefore can be used as an epoxy resin for producing semiconductor encapsulating material. It can also be incorporated into other thermosetting and thermoplastic resin material to produce various electronic products.

Accordingly, the present invention also relates to a use of the flame retarding phosphorous-containing epoxy resin of the present invention as a flame retarding agent in either thermosetting or thermoplastic resin.

Examples of the thermosetting resin in which the flame retarding phosphorous-containing epoxy resin of the present invention is suitable include, such as, epoxy resin and novolac resin, and the like. Examples of the thermoplastic resin in which the flame retarding phosphorous-containing epoxy resin of the present invention is suitable include, such as, polystyrene, polypropylne, polyterephthalate, polycarbonate, polystyrene, styrene-butadiene-styrene copolymer, acrylonitrile-butadiene-styrene copolymer, polyamide, polyimide, polysulfone, polyether sulfone, polyphenylene oxide, polyphenylene sulfide, and the like.

The present invention further relates to a flame retarding epoxy resin composition, which comprises the flame retarding phosphorous-containing epoxy resin of the present invention, a curing agent containing reactive hydrogen capable to react with an epoxy group, and a curing promoter.

The curing agent containing reactive hydrogen capable to react with an epoxy group used in the flame retarding epoxy resin composition, hereinafter referred to "the curing agent", can be various halogen-free curing agent, and includes bisphenol resin, polyhydroxy phenol resin, phenolic resin, and anhydride, and the like.

Examples of the bisphenol resin include compound of the formula HO—Ph—Z—Ph—OH (wherein Ph represents a phenylene group, Z=a chemical bond, —CH$_2$—C(CH$_3$)$_2$—, —O—, —S—, —CO— or —SO$_2$—). Embodiments of the bisphenol resin include, but not limited to, tetramethyl-bisphenol AD, tetramethylbisphenol S, 4,4'-biphenol, 3,3'-dimethyl-4,4'-biphenol, or 3,3',5,5'-tetramethyl-4,4'-biphenol, and the like.

Examples of the polyhydroxy phenol resin include, but not limited to, tris(4-hydroxyphenyl)methane, tris(4-hydroxyphenyl)ethane, tris(4-hydroxyphenyl)propane, tris (4-hydroxyphenyl)butane, tris(3-methyl-4-hydroxyphenyl) methane, tris(3,5-dimethyl-4-hydroxyphenyl)methane, tetrakis(4-hydroxyphenyl)methane, tetrakis(3,5-dimethyl-4-hydroxyphenyl)methane, and the like.

Examples of the phenolic resin include phenol-formaldehyde condensate, cresol-phenolic condensate, bisphenol A-phenolic condensate and dicyclopentadiene-phenolic condensate, and the like.

Examples of the anhydrides include, such as 3,3',4,4'-benzophenone-tetracarboxylic anhydride (BTDA), trimetallitic acid trianhydride (BTDA) and pyromellitic acid dianhydride, and the like.

The curing agent used in the flame retarding epoxy resin composition of the present invention can be a nitrogen- and phosphorus-containing curing agent of the following formula (II):

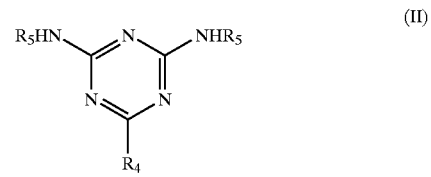

wherein $R_4$ represents —NHR$_5$, a $C_{1-6}$ alkyl group, or a $C_{6-10}$ aryl group which may further substituted with one or more substitutents selected from the group consisting of hydroxyl, amino, carboxy, and $C_{1-6}$ alkyl group;
$R_5$ represents a hydrogen atom, —(CH$_2$—R$_6$)$_c$—H or a group of the following formula (5):

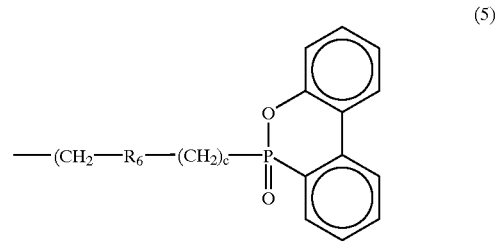

wherein $R_6$ represents a phenylene group, or a naphthalene group optionally substituted with one or more substitutents selected from the group consisting of hydroxyl, amino, carboxy, and $C_{1-6}$ alkyl group or represents the group of the following formula-:

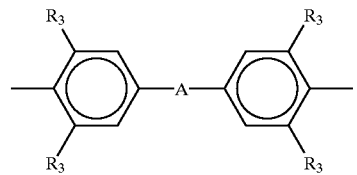

[wherein $R_3$ represents a $C_{1-6}$ alkyl group; A represents —O—, —S—, —SO$_2$—, —CO—, —CH$_2$—, —C(CH$_3$)$_2$—, or the group of the following group:

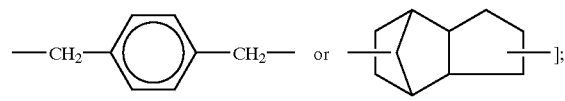

and
c represents an integral number of from 0 to 20;
provided that at least one R$_5$ is not a hydrogen atom.

The term "aryl group" used herein includes phenyl group and naphthyl group.

Examples of the curing promoter used in the flame retarding epoxy resin composition of the present invention include tertiary amine, tertiary phosphine, quaternary ammonium salt, phosphornium salt, boron trifluoride complex, lithium compound or imidazole compound, or a combination thereof.

Examples of the tertiary amine include trimethylamine, triethylamine, diisopropyl ethylamine, dimethyl ethanolamine, dimethylaniline, tris(N,N-dimethylaminomethyl)phenol, or N,N-dimethylaminemethylphenol, and the like.

Examples of the tertiary phosphine include triphenylphosphine.

Examples of the quaternary ammonium salt include tetramethylammonium chloride, tetramethylammonium bromide, triethylbenzylammonium chloride, triethylbenzylammonium bromide, or triethylbenzylammonium iodide, and the like.

Examples of the phosphornium salt include tetrabutylphosphornium chloride, tetrabutylphosphornium bromide, tetrabutylphosphornium iodide, tetrabutylphosphate acetate complex, tetraphenylphosphornium chloride, tetraphenylphosphornium bromide, tetraphenylphosphornium iodide, ethyltriphenylphosphornium chloride, ethyltriphenylphosphornium bromide, ethyltriphenylphosphornium iodide, ethyltriphenylphosphate acetate complex, ethyltriphenylphosphate phosphate complex, propyltriphenylphosphornium chloride, propyltriphenylphosphornium bromide, propyltriphenylphosphornium iodide, butyltriphenylphosphornium chloride, butyltriphenylphosphornium bromide, and butyltriphenylphosphornium iodide, and the like.

These curimg promoter can be used along or in a combination thereof

The flame retarding epoxy resin composition of the present invention, in addition to the flame retarding nitrogen-containing epoxy resin of the present invention, can also comprise other conventional epoxy resin. Examples of the conventional resin include, for example, bisphenol glycidyl ether, bis(diphenol) glycidyl ether, resorcinol glycidyl ether, glycidyl ether of a nitrogen-containing ring, glycidyl ether of dihydroxynaphthalene, phenolic polyglycidyl ether, and polyhydroxy phenol polyglycidyl ether, and the like.

Examples of the bisphenol glycidyl ether include, for example, bisphenol A glycidyl ether, bisphenol F glycidyl ether, bisphenol AD glycidyl ether, bisphenol S glycidyl ether, tetramethyl-bisphenol AD glycidyl ether, and tetramethyl-bisphenol AD glycidyl ether, etc.

Examples of the bis(diphenol) glycidyl ether include, for example, 4,4'-biphenol glycidyl ether, 3,3'-dimethyl-4,4'-biphenol glycidyl ether, and 3,3',5,5'-tetramethyl-4,4'-biphenol glycidyl ether, etc.

Examples of the phenolic polyglycidyl ether include, for example, phenolic polyglycidyl ether, cresol-phenolic polyglycidyl ether, and bisphenol A-phenolic polyglycidyl ether, etc.

Examples of the polyhydroxy phenol polyglycidyl ether include, for example, tris(4-hydroxyphenyl)methane polyglycidyl ether, tris(4-hydroxyphenyl)ethane polyglycidyl ether, tris(4-hydroxyphenyl)propane polyglycidyl ether, tris(4-hydroxyphenyl)butane polyglycidyl ether, tris(3-methyl-4-hydroxyphenyl)methane polyglycidyl ether, tris(3,5-dimethyl-4-hydroxyphenyl)methane polyglycidyl ether, tetrakis(4-hydroxyphenyl) ethane polyglycidyl ether, tetrakis(3,5-dimethyl-4-hydroxyphenyl)ethane polyglycidyl ether, dicyclopentene-phenolic polyglycidyl ether, and a mixture thereof.

Examples of the glycidyl ether of a nitrogen-containing ring include, for example, glycidyl ether of isocyuric acid and glycidyl ether of isocyurate.

Examples of the glycidyl ether of dihydroxy-naphthalene include, for example, 1,6-dihydroxynaphthalene diglycidyl ether and 2,6-dihydroxynaphthalene diglycidyl ether.

These epoxy resins can be used alone or in a mixture thereof in the phosphorous-containing epoxy resin composition of the present invention. Among them, bisphenol A glycidyl ether, phenolic polyglycidyl ether, tris(4-hydroxyphenyl)methane polyglycidyl ether, dicyclopentene-phenolic polyglycidyl ether, tetrakis(4-hydroxyphenyl)ethane polyglycidyl ether, or a mixture thereof is preferable.

When the flame retarding epoxy resin composition of the present invention contains both the flame retarding phosphorous-containing epoxy resin of the present invention and conventional epoxy resin, the weight ratio of the flame retarding phosphorous-containing epoxy resin of the present invention to the conventional epoxy resin is (3-100):(97-0), preferably (10-80):(90-20). If the amount of the flame retarding phosphorous-containing epoxy resin of the present invention is less than 3% by weight, a retarding property and a heat resistance of an article prepared from the resin composition of the present invention are insufficient.

In the flame retarding epoxy resin composition of the present invention, the amount of the curing agent depends on the epoxy equivalent of the used epoxy resin and the active hydrogen equivalent of the curing agent. Generally, the ratio of the epoxy equivalent of the epoxy resin to the active hydrogen equivalent of the curung agent is from 1:0.5 to 1:1.5, preferably from 1:0.6 to 1:1.4, more preferably from 1:0.7to 1:1.3.

In the flame retarding epoxy resin composition of the present invention, the amount of the curing promoter is from 0.01 to 5% by weight, preferably from 0.05 to 3% by weight, relative to the total weight of the flame retarding epoxy resin composition of the present invention. If the amount of the curing promoter is more than 5% by weight, although it causes shorten reaction time, it easily produces byproduct, which adversely affects the electronic property, moisture resistance, water absorbability in the final use. If the amount is less than 0.01% by weight, the reaction rate is too low so that the production is decreased.

The amount of the curing promoter also depends on a gelling time and viscosity of the flame retarding epoxy resin composition of the present invention. Generally, the curing promoter is added in an amount that controls the gelling time of the flame retarding epoxy resin composition of the present invention in the range of 30 to 500 sec/171□, and the viscosity of the flame retarding epoxy resin composition of the present invention in the range of 20 to 500 cps/25□.

The flame retarding epoxy resin composition of the present invention further comprises other additives, for example, such as inorganic filler, coupling agent, pigment (e.g. carbon black and ferrous oxide), molding release agent and low stress additives.

Examples of the inorganic filler suitably used in the flame retarding epoxy resin composition of the present invention include sphere type and cornered type molten silica, crystalline silica, and the like, and quartz glass powder, talc powder, alumina powder, zinc borate, aluminum hydroxide, magnesium hydroxide, calcium carbonate, aluminum nitride, and the like. These filler can be used alone or in a combination thereof. With the cornered type molten silica, crystalline silica, and a mixture of the cornered type molten silica and crystalline silica are preferred.

An average particle size of these inorganic filler is preferably from 1 to 30 microns. If the average particle size is less than 1 micron, it will cause the increasing viscosity and decreasing flow ability of the resin composition. If the average particle size is more than 30 micron, it will cause uneven dispersion of the resin and of the filler in the epoxy resin composition, which will in turn cause resin overflowing during encapsulating application and affect physical property of the cured article. Additionally, the maximum particle size is preferably less than 150 microns to avoid causing a narrow casting channel or poor filling of voids.

The amount of the inorganic filler is from 60 to 92% by weight, preferably from 65 to 90% by weight based on the total weight of the flame retarding epoxy resin composition of the present invention. If the amount of the inorganic filler is less than 60% by weight, the relative ratio of the epoxy resin in the resin composition will be increased so that an overflowing of the resin easily occurs during encapsulating. If the amount of the inorganic filler is more than 92% by weight, a viscosity of the resin composition will increase and result in the decrease of flow ability.

The present invention will further illustrate by reference to the following synthesis examples, working examples, and comparative examples. However, these synthesis examples and working examples are not intended to be limiting of the scope of the present invention.

The epoxy equivalent weight (EEW), the viscosity, and a soften point used herein are determined according to the following methods:

(1) Epoxy Equivalent Weight (EEW): The epoxy equivalent weight (EEW) is determined according to the method of ASTM 1652, the epoxy resin to be tested is dissolved in a mixture solvent of chlorobenzene:chloroform in a weight ratio of 1:1, the resultant mixture is titrated with HBr/glacial acid by using crystalline violet as an indicator.

(2) Viscosity: The viscosity is determined by placing the epoxy resin to be tested in a thermostat maintaining at 25□ for 4 hours and measuring the viscosity by using Brookfield Viscosmeter at 25□.

(3) Soften point: The soften point is determined by applying the epoxy resin to be tested on an O-ring, placing a ball on the applied epoxy resin, gradually heating the epoxy resin, and measuring the temperature when the ball falls into the O-ring.

Each ingredient used in these synthesis examples, working examples, and comparative examples are illustrated as follows.

Epoxy resin A: polyglycidyl ether of cresol-phenolic condensate having an epoxy equivalent weight of 200 to 220 gram/equivalent and a hydrolyzable chlorine of below 200 ppm, under trade name of CNE 200ELB sold and manufactured by Chang Chun Plastic Co., Ltd., Taiwan, R.O.C.

Epoxy resin B: 3,3',5,5'-tetramethyl-4,4'-biphenol having an epoxy equivalent weight of 180 to 195 grams/equivalent, under trade name of YX4000H sold and manufactured by Yuka Shell Epoxy Co. Ltd., Japan.

Epoxy resin C: a diglycidyl ether of tetrabromobisphenol A having an epoxy equivalent weight of 330 to 350 grams/equivalent, under trade name of BEB350 sold and manufactured by Chang Chun Plastic Co., Ltd., Taiwan, R.O.C.

Curing agent A: a curing agent having reactive hydrogen of 105 to 110 grams/equivalent, under trade name of PF-5110 sold and manufactured by Chang Chun Plastic Co., Ltd., Taiwan, R.O.C.

Curing agent B: a nitrogen- and phosphorus-containing curing agent prepared from the following Synthesis Example 3.

Curing promoter A: triphenylphosphine.

Curing promoter B: 2-methylimidazole (hereinafter referred to 2MI).

SYNTHESIS EXAMPLE 1

Preparation of Phosphorous-Containing EPOXY Resin D

Organic phosphorous cyclic compound HCA of which formula is referred hereinafter (216 grams) and toluene (216 grams) were charged into a glass reaction flask and the mixture was heated and stirred until HCA was dissolved. The temperature was raised to 110□ then 4-hydroxybenaldehyde (112 grams) was added and reacted at the temperature for 2 hours. The reaction mixture was cooled to room temperature, filtered and dried to obtain a phosphorous-containing condensate (a) of HCA and 4-hydroxybenaldehyde.

The condensate (a) (338 grams) and toluene (338 grams) were charged into a glass reaction flask and heated while stirring. After the condensate (a) being dissolved, the temperature was raised to 110□ and phenol (94 grams) and p-methylsulphonic acid (3.4 grams) were added into the mixture and maintained at the temperature for 2 hours. The reaction mixture was cooled to room temperature and then filtered. The filtrate was dried to obtain a phosphorous-containing condensate (b) having a melting point of 294□.

The resultant phosphorous-containing condensate (b) (413 grams) and epichlorohydrin (925 grams) were charged into a glass reaction flask and heated while stirring. After each ingredient being dissolved, the temperature was raised to 55□ and 49.5% aqueous sodium hydroxide solution (153.5 grams) was added into the mixture and maintained at the temperature for 5 hours. After. the reaction completed, the temperature was further raised to recover unreacted epichlorohydrin. Into the residue was added solvent and water to remove salted water and a resin was filtered out. Solvent was distillated off to give 518 grams of the phosphorous-containing epoxy resin of the present invention (hereinafter referred to epoxy resin D), which epoxy equivalent weight is analyzed to be 228 grams/equivalent and soften point is analyzed to be 85□. Note: HCA is a phosphorus-containing compound is presented by the following formula:

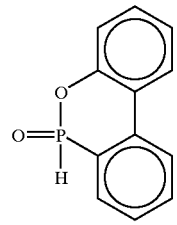

SYNTHESIS EXAMPLE 2

Preparation of Phosphorous-Containing Epoxy Resin E

A Phosphorous-Containing Epoxy Resin E was prepared analogous to the method of Synthesis Example 1 except that o-cresol (108 grams) was used instead of phenol to obtain 539 grams of the phosphorous-containing epoxy resin E of the present invention, which epoxy equivalent weight is analyzed to be 300 grams/equivalent and soften point is analyzed to be 95°C.

SYNTHESIS EXAMPLE 3

Preparation of Nitrogen- and Phosphorus-Containing Curing Agent B 1410 grams of phenol (15 moles), 244.7 grams of 92% polyformaldehye (7.5 moles), 337 grams of benzoguanamine (1.8 moles), 259 grams of HCA (1.2 moles) and 11.2 grams of oxalic acid were into a 3 liters 5-neck flask equipped with electronic heating housing, thermostat, electronic stirrer, nitrogen inlet, thermocouple, water cooling condenser, and added funnel. After all ingredients were dissolved, the mixture was dried under a vacuum, purged of nitrogen, and vacuumed again. The flask temperature was raised to 100 to 110°C and the reaction proceeded for 3 hours. The flask temperature was further raised to 120 to 125°C and the reaction proceeded for 2 hours. After the reaction completed, unreacted phenol and $H_2O$ generated from the reaction were gradually distillated off at a normal atmosphere. The mixture was finally maintained at a temperature of 180°C for 1 hour to give the desired nitrogen- and phosphorus-containing curing agent B. The nitrogen- and phosphorus-containing curing agent B was analyzed for its soften point to be 161°C. A theory nitrogen content was to be 10.0%, a theory phosphorus content was to be 2.93%, and reactive hydrogen equivalent was to be 210 grams/equivalent.

Working Examples and Comparative Examples

Working Example 1- A preparation of flame retarding epoxy resin composition

The flame retarding epoxy resin composition of the present invention was prepared from the ingredients listed below.

| | |
|---|---|
| Epoxy resin A | 10.34 parts by weight |
| Phosphorous-containing Epoxy resin D | 6.00 parts by weight |
| Curing agent A | 7.80 parts by weight |
| Curing promoter A | 0.26 parts by weight |
| Silane coupling agent | 0.60 parts by weight |
| Silicone dioxide | 74.0 parts by weight |
| Carbon black | 0.40 parts by weight |
| Carnauba wax | 0.60 parts by weight |

All ingredients were charged into a container and thoroughly stirred by a mechanical stirrer. The mixture was kneaded at a temperature of 95°C by using a dual screw roller, cooled and pulverized to obtain the flame retarding epoxy resin composition of the present invention for semiconductor encapsulating.

Working Examples 2 to 8 and Comparative Examples 1 to 3

Following the procedures of the work example 1, the epoxy resin compositions of working examples 2 to 9 and comparative examples were prepared from the ingredients and its amount listed in Table 1.

TABLE 1

(parts by weight)

| | Working Example No. | | | | | | | Comparative Example No. | | |
|---|---|---|---|---|---|---|---|---|---|---|
| | 2 | 3 | 4 | 5 | 6 | 7 | 8 | 1 | 2 | 3 |
| Epoxy Resin A | 12.34 | 12.2 | — | 12.34 | — | 6.2 | 6.12 | 15.84 | — | 12.84 |
| Epoxy Resin B | — | — | 12.34 | — | 12.2 | 6.14 | 6.1 | — | 15.2 | — |
| Epoxy Resin C | — | — | — | — | — | — | — | — | — | 2.0 |
| Epoxy Resin D | 4.0 | 4.0 | 4.0 | — | — | 2.0 | 2.0 | 0.5 | — | — |
| Epoxy Resin E | — | — | — | 4.0 | 4.0 | 2.0 | 2.0 | — | — | — |
| $Sb_2O_3$ | — | — | — | — | — | — | — | — | — | 1.5 |
| Triphenyl phosphate | — | — | — | — | — | — | — | — | 3.0 | — |
| Curing agent A | 7.8 | 7.1 | 7.8 | 7.8 | 7.1 | 7.8 | 7.0 | 8.1 | 8.1 | 7.8 |
| Curing agent B | — | 1.0 | — | — | 1.0 | — | 1.0 | — | — | — |
| Curing promoter A | 0.26 | 0.13 | 0.26 | 0.26 | 0.13 | 0.26 | 0.13 | 0.26 | 0.13 | 0.26 |
| Curing promoter B | — | 0.05 | — | — | 0.05 | — | 0.05 | — | 0.05 | — |
| Silane coupling agent | 0.6 | 0.6 | 0.6 | 0.6 | 0.6 | 0.6 | 0.6 | 0.6 | 0.6 | 0.6 |
| Molten silicone dioxide | 74.0 | 74.0 | 74.0 | 74.0 | 74.0 | 74.0 | 74.0 | 74.0 | 74.0 | 74.0 |
| Carbon black | 0.4 | 0.4 | 0.4 | 0.4 | 0.4 | 0.4 | 0.4 | 0.4 | 0.4 | 0.4 |
| Carnauba wax | 0.6 | 0.6 | 0.6 | 0.6 | 0.6 | 0.6 | 0.6 | 0.6 | 0.6 | 0.6 |

Characteristics of the prepared epoxy resin compositions were determined according to the following methods and the results were shown in Table 2.

(1) Helix flowability: According to the method of EMMI-1-66, the epoxy resin composition to be tested was determined its helix flowability at 175°C and 70 kg/cm². The results were shown in Table 2.

(2) Flame resistance: The epoxy resin composition to be tested were made into a sheet having a dimension of 5" length, 0.5" width, and 1/16" thick and tested its flame resistance according to UL 94 specification. Each of five sheets prepared from the same epoxy resin composition was burned twice and a burning time was recorded. The test was passed if a total burning time for 10 burnings did not exceed 50 seconds and each burning time did not exceed 10 seconds. The results were shown in Table 2. An average burning time was also calculated and shown in Table 3.

(3) Moisture absorption: A circular sheet having a diameter of 25 mm and a thickness of 5 mm was prepared from the epoxy resin composition to be tested and then weighted ($W_i$). The sheet was boiled in a boiling water at a temperature of 100□ for 24 hours and weighted again ($W_e$). The moisture absorption is defined according following equation:

Moisture absorption=$(W_e-W_i)/W_i\times100\%$ (4) Solder heat resistance: A 18-pin dual leadframe (18LD-PDIP) was encapsulating with the epoxy resin composition to be tested at 175□ and cured at the same temperature for 4 hours. The cured article was treated under a condition of 85□/85% for 72 hours and then heated in a solder tank at a temperature of 240□ for 10 seconds three times. The cured article was visually examined whether crack occurred on the appearance.

The Working Examples 2 to 9 containing the flame retarding nitrogen-containing epoxy resin exhibit better solder resistance than the Comparative Examples.

Although Comparative Example 1 uses the flame retarding phosphorous-containing epoxy resin, it does not pass the UL94 V-0 test and exhibits poor solder heat resistance due to containing less than 0.5% by weight of the flame retarding phosphorous-containing epoxy resin of the present invention.

The epoxy resin composition of Comparative Example 2 using a non-reactive flame retarding agent triphenyl phosphate passes the 94UL V-0 flame resistance test, but its flow ability becomes poor and exhibits poor moisture absorption and poor solder heat resistance.

Comparative Example 3 uses conventional bromine-containing epoxy resin and Sb-containing flame retarding agent. To attain the desired flame resistance, the amounts of the bromine-containing epoxy resin and Sb-containing flame retarding agent should be increased so that the amount of usual epoxy resin will be decreased, which in turn results in poor flow ability. The epoxy resin of the Comparative

TABLE 2

|  | Working Example |  |  |  |  |  |  | Comparative Example |  |  |
|---|---|---|---|---|---|---|---|---|---|---|
|  | 2 | 3 | 4 | 5 | 6 | 7 | 8 | 1 | 2 | 3 |
| Helix Flowability (cm) | 75 | 72 | 80 | 75 | 75 | 75 | 72 | 78 | 60 | 65 |
| Flame Resistance UL-94 | V-0 | V-0 | V-0 | V-0 | V-0 | V-0 | V-0 | V-1 | V-0 | V-0 |
| Moisture Absorption | 0.27 | 0.28 | 0.27 | 0.27 | 0.28 | 0.27 | 0.28 | 0.25 | 0.37 | 0.24 |
| Solder Heat Resistance | 0/10 | 0/10 | 0/10 | 0/10 | 0/10 | 0/10 | 0/10 | 2/10 | 3/10 | 2/10 |
| Note |  |  |  |  |  |  |  |  | * | ** |

* poor flowability
** a bromine-containing formulation

TABLE 3

|  | Working Example |  |  |  |  |  |  | Comparative Example |  |  |
|---|---|---|---|---|---|---|---|---|---|---|
|  | 2 | 3 | 4 | 5 | 6 | 7 | 8 | 1 | 2 | 3 |
| average burning time(s) | 2–3 | 1–2 | 2–3 | 2–3 | 1–2 | 2–3 | 2–3 | 10 more | 3–4 | 1–2 |

In the Working Examples and Comparative Examples, Working Examples 2 to 8 contain the flame retarding phosphorous-containing epoxy resins D and/or E of the present invention and each Working Examples use various epoxy resins and curing promoters to prepare flame retarding epoxy resin compositions. Comparative Example 1 uses the flame retarding phosphorous-containing epoxy resins D in an amount of less than 0.5% by weight. Comparative Example 2 uses non-reactive triphenyl phosphate flame retarding agent and Comparative Example 3 uses bromine-containing epoxy resin and Sb-containing flame retarding agent. From the above results, it is known that although all Working Examples and Comparative Examples results, it is clear that those Working examples and Comparative examples exhibit flame retarding property and comparative flame resistance (except for Comparative Example 1), and pass the UL94 V-0 test without affecting helix flow ability.

Example 3 exhibits a poorer solder heat resistance than the Working Examples of the present invention.

Industrial Utility

The flame retarding phosphorous-containing epoxy resin of the present invention and an epoxy resin composition containing the same possess excellent flame retarding property and heat resistance. Therefore the flame retarding phosphorous-containing epoxy resin of the present invention and an epoxy resin composition containing the same are useful as an encapsulating material in the semiconductor industry without adding additional flame retarding agent. Also, the cured article prepared from the resin composition of the present invention exhibits excellent molding ability and excellent reliance.

Moreover, due to the excellent flame retarding property and heat resistance, the flame retarding phosphorous-containing epoxy resin of the present invention is useful for preparing resin reinforced material prepreg, laminate, printing circuit board, electronic encapsulating material, electric parts such as connector, transformer, power switch, relay, housing material, and coil material, electronic products, automobile products and machinery products, and the like.

What are the claims are:

1. A flame retarding phosphorous-containing epoxy resin of the following formula:

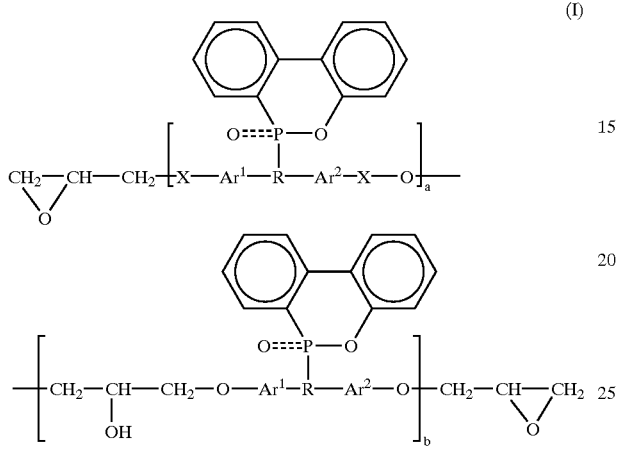

wherein R represents a C1–6 alkylene group;
 a represents an integral number of from 1 to 10;
 b represents an integral number of from 0 to 10;
 X represents a group of formula —(O—CH$_2$—CH(OH)—CH$_2$—O—M—)$_y$—, in which y represents an integral number of from 0 to 20; and M represents a group selected from the following groups (E1)☐(E2), and (E3):

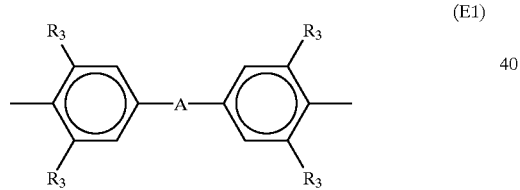

wherein R$_3$ represents a C$_{1-6}$ alkyl group; A represents a chemical bond, —O—, —S—, —SO$_2$—, —CO—, C$_{1-6}$ alkylene group, or a group of the following formula:

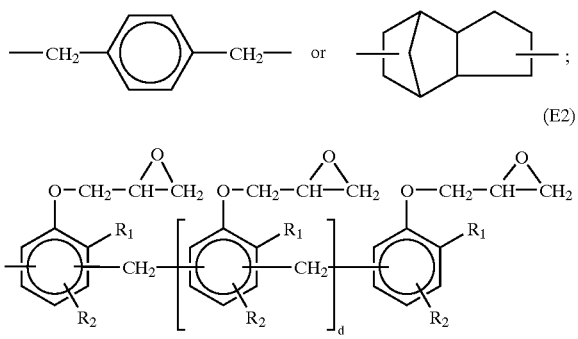

wherein R$_1$ represents a hydrogen atom or a C$_{1-6}$ alkyl group, d represents an integral number of from 0 to 6, R$_2$s are the same or different and represent a hydrogen atom or a group of the following formula:

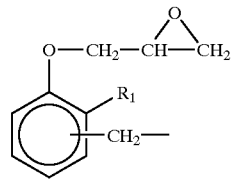

in which R$_1$ is the same as defined above;

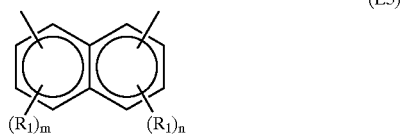

in which R$_1$ is the same as defined above; m and n are the same or different and represent an integral number of from 0 to 3;
Ar$^1$ and Ar$^2$ are the same or different and represent a group selected from the following formulae (E3) or (E4):

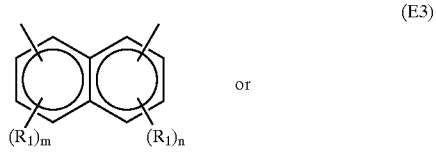

wherein R$_1$, m, and n are the same as defined above.

2. A flame retarding epoxy resin composition comprising the flame retarding phosphorous-containing epoxy resin according to claim 1, a curing agent containing reactive hydrogen capable of reacting with an epoxy group, and a curing promoter.

3. The flame retarding epoxy resin composition according to claim 2, wherein the ratio of the epoxy equivalent of the epoxy resin to the active hydrogen equivalent of the curing agent is from 1:0.5 to 1:1.5.

4. The flame retarding epoxy resin composition according to claim 2, wherein the amount of the curing promoter is from 0.01 to 5% by weight, relative to the total weight of the flame retarding epoxy resin composition.

5. The flame retarding epoxy resin composition according to claim 2, which further comprises other epoxy resin selected from the group consisting of bisphenol glycidyl ether, bis(diphenol) glycidyl ether, resorcinol glycidyl ether, glycidyl ether of a nitrogen-containing ring, glycidyl ether of dihydroxynaphthalene, phenolic polyglycidyl ether, and polyhydroxy phenol polyglycidyl ether.

6. The flame retarding epoxy resin composition according to claim 5, wherein the amount of the other epoxy resin is from 0 to 97% by weight, relative to the total weight of the epoxy resin contained in the flame retarding epoxy resin composition.

7. The flame retarding epoxy resin composition according to claim 2, wherein the curing agent is selected from the group consisting of bisphenol resin, polyhydroxy phenol resin, phenolic resin, and anhydride.

8. The flame retarding epoxy resin composition according to claim 2, which further comprises a nitrogen- and phosphorus-containing curing agent of the following formula:

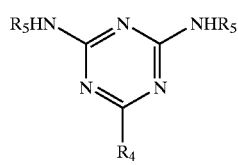
(II)

wherein $R_4$ represents —$NHR_5$, a $C_{1-6}$ alkyl group, or a $C_{6-10}$ aryl group which may further substituted with one or more substitutents selected from the group consisting of hydroxyl, amino, carboxy, and $C_{1-6}$ alkyl group;

$R_5$ represents a hydrogen atom, —$(CH_2$—$R_6)_c$—H or a group of the following formula (5):

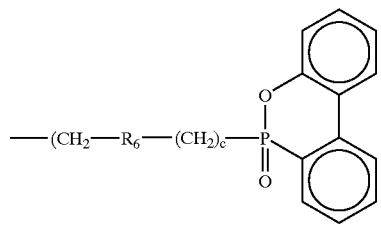
(5)

wherein $R_6$ represents a phenylene group, or a naphthalene group optionally substituted with one or more substitutents selected from the group consisting of hydroxyl, amino, carboxy, and $C_{1-6}$ alkyl group or represents the group of the following formula-:

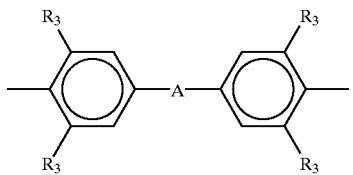

[wherein $R_3$ represents a $C_{1-6}$ alkyl group; A represents —O—, —S—, —$SO_2$—, —CO—, —$CH_2$—, —$C(CH_3)_2$—, or the group of the following group:

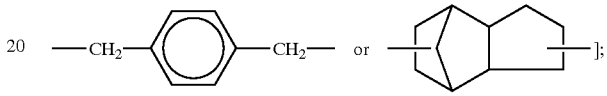

and c represents an integral number of from 0 to 20;

provided that at least one $R_5$ is not a hydrogen atom.

9. The flame retarding epoxy resin composition according to claim 2, which further comprises other additives selected from the group consisting of inorganic filler, coupling agent, pigment, molding release agent and low stress additives.

* * * * *